(12) United States Patent
Uchida et al.

(10) Patent No.: US 11,447,114 B2
(45) Date of Patent: Sep. 20, 2022

(54) LIQUID PRESSURE CONTROL DEVICE AND METHOD FOR MANUFACTURING SAME

(71) Applicant: ADVICS CO., LTD., Kariya (JP)

(72) Inventors: Miyuki Uchida, Ichinomiya (JP); Yoshihiro Miyata, Kariya (JP)

(73) Assignee: ADVICS CO., LTD., Kariya (JP)

( * ) Notice: Subject to any disclaimer, the term of this patent is extended or adjusted under 35 U.S.C. 154(b) by 404 days.

(21) Appl. No.: 16/639,203

(22) PCT Filed: Aug. 10, 2018

(86) PCT No.: PCT/JP2018/030010
§ 371 (c)(1),
(2) Date: Feb. 14, 2020

(87) PCT Pub. No.: WO2019/039309
PCT Pub. Date: Feb. 28, 2019

(65) Prior Publication Data
US 2020/0216050 A1 Jul. 9, 2020

(30) Foreign Application Priority Data
Aug. 23, 2017 (JP) .............................. JP2017-160590

(51) Int. Cl.
*B60T 13/66* (2006.01)
*H01R 12/71* (2011.01)
*H05K 5/00* (2006.01)

(52) U.S. Cl.
CPC ............ *B60T 13/66* (2013.01); *H01R 12/714* (2013.01); *H05K 5/006* (2013.01)

(58) Field of Classification Search
CPC ...... H01R 12/714; H05K 5/006; B60T 17/04; B60T 8/343
See application file for complete search history.

(56) References Cited

U.S. PATENT DOCUMENTS 9,698,506 B2 * 7/2017 Miyake .................. H01R 12/58
2012/0196486 A1 * 8/2012 Midorikawa .......... H01R 12/73
439/660

(Continued)

FOREIGN PATENT DOCUMENTS

JP   2014-187062 A    10/2014
JP   2015219132 A     12/2015

OTHER PUBLICATIONS

International Search Report (PCT/ISA/210) dated Oct. 9, 2018, by the Japan Patent Office as the International Searching Authority for International Application No. PCT/JP2018/030010.

(Continued)

*Primary Examiner* — Jean F Duverne
(74) *Attorney, Agent, or Firm* — Buchanan Ingersoll & Rooney PC

(57) ABSTRACT

A liquid pressure control device includes a deformable part positioned in a deformed state between a housing and a case in an assembled state in which the housing and the case are assembled. When a first load is applied to the deformable part in a non-assembled state in which the case is separated further from the housing in a first direction than in the assembled state, the deformable part can place the housing and the case in a separation state in which a second end portion supported by a bottom wall is separated from a terminal in the first direction. When a second load greater than the first load is applied in the non-assembled state, the deformable part is deformed by the second load and can place the housing and the case in a contact state in which the second end portion and the terminal contact each other.

11 Claims, 17 Drawing Sheets

(56) References Cited

U.S. PATENT DOCUMENTS

2014/0285987 A1    9/2014  Nagashima et al.
2016/0141782 A1*  5/2016  Miyake .............. H01R 12/7076
                                                                     439/884

OTHER PUBLICATIONS

Written Opinion (PCT/ISA/237) dated Oct. 9, 2018, by the Japan Patent Office as the International Searching Authority for International Application No. PCT/JP2018/030010.

* cited by examiner

LIQUID PRESSURE CONTROL DEVICE AND METHOD FOR MANUFACTURING SAME

TECHNICAL FIELD

The present disclosure relates to a liquid pressure control device and a method for manufacturing the same.

BACKGROUND ART

Conventionally, there is known a sensor device in which a land of a circuit board and a terminal of a sensor portion are electrically connected by a spring (Patent Literature 1). A groove is processed in the terminal of the sensor portion or a spherical portion is formed in the terminal to prevent the spring from falling when the circuit board is assembled.

CITATIONS LIST

Patent Literature

Patent Literature 1: Japanese Unexamined Patent Publication No. 2015-219132

SUMMARY OF INVENTION

Technical Problems

However, in the above-described prior art, manufacturing costs increase because the groove is processed in the terminal of the sensor portion or the spherical portion is provided in the terminal.

Thus, one of problems of the present invention is to obtain a liquid pressure control device and a method for manufacturing the same, capable of preventing a connecting member such as a spring from falling when the circuit board is assembled at a lower manufacturing cost.

Solutions to Problems

A liquid pressure control device of the present disclosure, for example, includes: a housing having a first surface intersecting a first direction, being provided inside with a fluid passage; a case having a peripheral wall, a lower surface positioned inside the peripheral wall, spaced from the first surface in the first direction, facing the first surface, an upper surface opposite to the lower surface, and a partition wall provided with a recessed portion recessed from the upper surface in a direction opposite to the first direction, and with a through hole passing through a bottom wall of the recessed portion; a circuit board for liquid pressure control, having a connection surface facing the upper surface, and a land provided on the connection surface; a connection conductor having a first end portion protruding from the recessed portion, being an end portion in the first direction, and a second end portion accommodated in the recessed portion, being an end portion in a direction opposite to the first direction, the connection conductor being electrically connected to the land in an elastically deformed state; a sensor attached to the housing, having a terminal protruding in the first direction and passing through the through hole, the terminal being in contact with the second end portion and electrically connected to the second end portion; and a deformable part positioned in a deformed state between the housing and the case in an assembled state in which the housing and the case are assembled, the deformable part enabling the housing and the case to be in a separation state in which the second end portion supported by the bottom wall is spaced from the terminal in the first direction when a first load is applied in a non-assembled state in which the case is further spaced from the housing in the first direction than in the assembled state, and the deformable part being deformed when a second load larger than the first load is applied in the non-assembled state, due to the second load, to enable the housing and the case to be in a contact state in which the second end portion and the terminal are in contact with each other.

In the above liquid pressure control device, the circuit board can be assembled into the case in a state in which the terminal is not in contact with the second end portion of the connection conductor. This enables avoiding an event when the circuit board is assembled into the case, in which the connection conductor is pushed in the first direction relatively by the terminal of the sensor to come out of the recessed portion and fall due to the case approaching the housing. In addition, a groove is not required to be processed in the terminal of the sensor, and a spherical portion is not required to be provided in the terminal. Accordingly, manufacturing effort and cost can be further reduced.

A method for manufacturing a liquid pressure control device of the present disclosure is for the liquid pressure control device, for example, including: a housing having a first surface intersecting a first direction, being provided inside with a fluid passage; a case having a peripheral wall, a lower surface positioned inside the peripheral wall, spaced from the first surface in the first direction, facing the first surface, an upper surface opposite to the lower surface, and a partition wall provided with a recessed portion recessed from the upper surface in a direction opposite to the first direction, and with a through hole passing through a bottom wall of the recessed portion; a circuit board for liquid pressure control, having a connection surface facing the upper surface, and a land provided on the connection surface; a connection conductor having a first end portion protruding from the recessed portion, being an end portion in the first direction, and a second end portion accommodated in the recessed portion, being an end portion in a direction opposite to the first direction, the connection conductor being electrically connected to the land in an elastically deformed state; and a sensor attached to the housing, having a terminal protruding in the first direction and passing through the through hole, the terminal being in contact with the second end portion and electrically connected to the second end portion, the method including: a first step of applying a first load to an elasticity retention mechanism to hold the circuit board by the elasticity retention mechanism by pressing the circuit board against the case in a direction opposite to the first direction, while the case is supported in the first direction by a support part, to cause a separation state in which the case is further spaced from the housing in the first direction than in an assembled state in which the housing and the case are assembled, and in which the second end portion supported by the bottom wall is spaced from the terminal in the first direction; and a second step of causing the case to approach the housing in the direction opposite to the first direction with the circuit board held by the elasticity retention mechanism to assemble the housing and the case.

In the method for manufacturing a liquid pressure control device, the second end portion is spaced from the terminal in the first direction when the circuit board is pressed. This enables avoiding an event when the circuit board is assembled into the case, in which the connection conductor is pushed in the first direction relatively by the terminal of the sensor to come out of the recessed portion and fall due to the case approaching the housing.

DESCRIPTION OF EMBODIMENTS

Hereinafter, exemplary embodiments of the present invention will be disclosed. Structure of the embodiments illustrated below, and operation and result (effect) given by the structure, are examples. The present invention is feasible using structure other than that disclosed in the following embodiments. According to the present invention, at least one of various effects (including derivative effects) obtained with structure can be obtained. All drawings are schematic and illustrative.

In the following plurality of embodiments, similar components are included. Thus, similar components are denoted by common reference signs below, and duplicated description is eliminated. In the plurality of embodiments, similar actions and effects based on similar components are acquired.

First Embodiment

Figure 1:
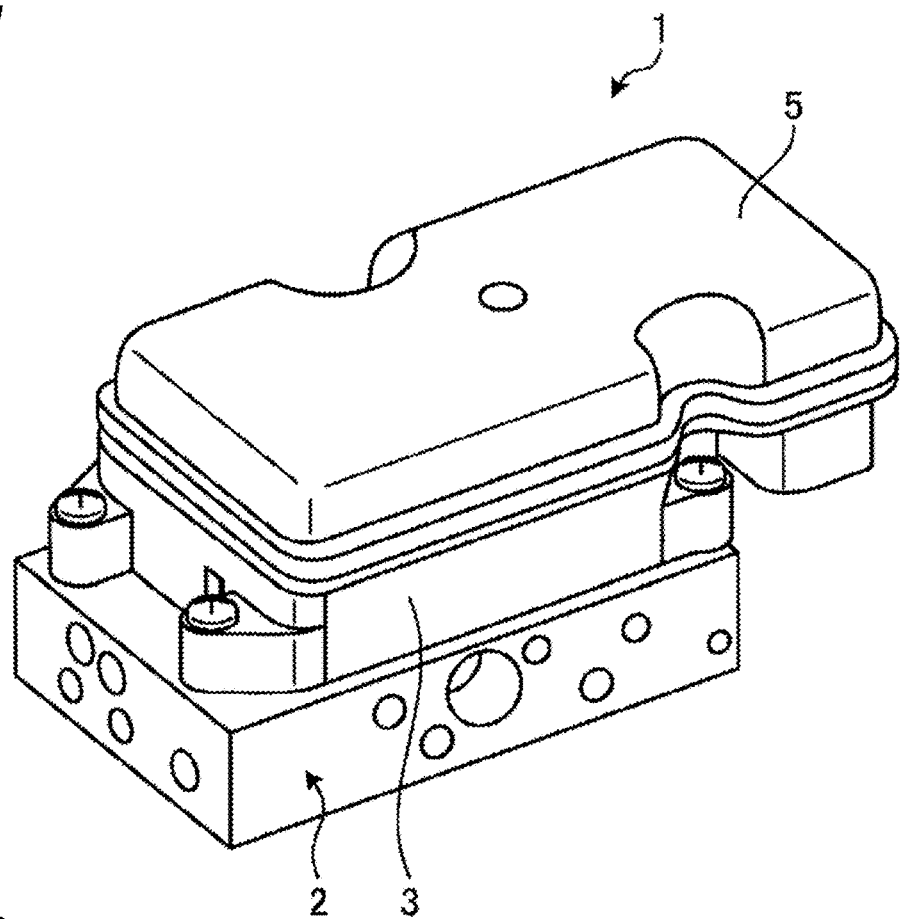
FIG. 1 is a perspective view illustrating a brake ECU according to a first embodiment.
Figure 2:
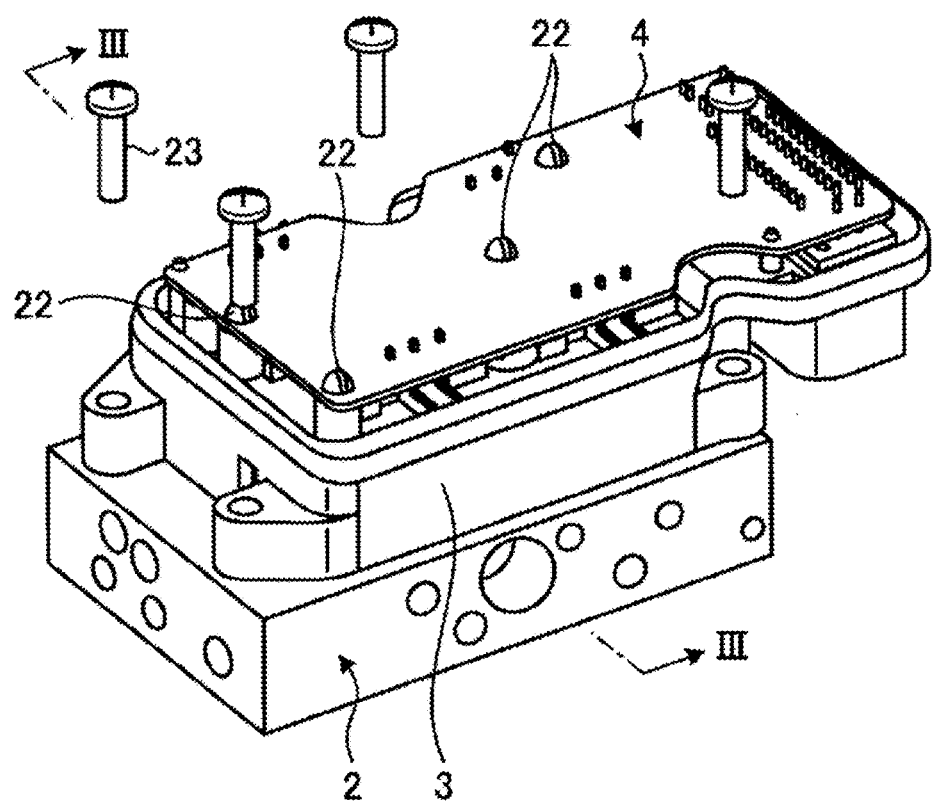
FIG. 2 is a perspective view illustrating a state in which a cover is removed from the brake ECU in FIG. 1.
Figure 3:
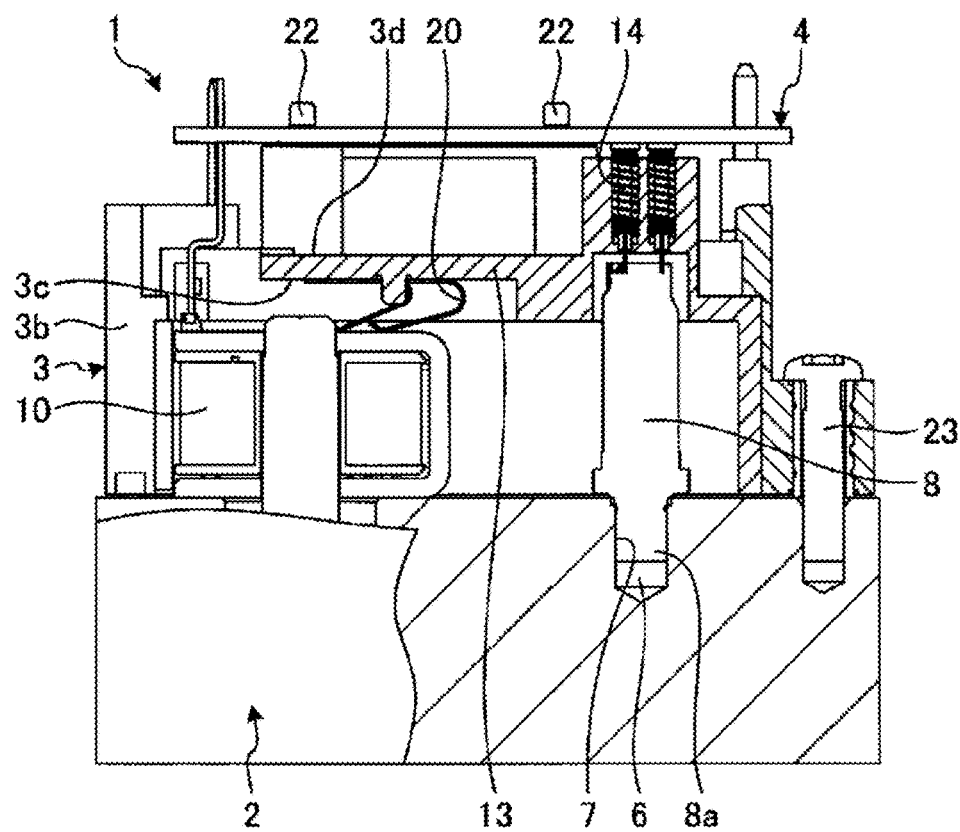
FIG. 3 is a cross-sectional view of the brake ECU according to the first embodiment, and is a cross-sectional view taken along line in FIG. 2.

As illustrated in FIGS. 1 to 3, a brake ECU (electronic control unit) 1 according to a first embodiment includes a housing 2 disposed on a lower side of each drawing, a case 3 assembled on the housing 2, a circuit board 4 held above the case 3, and a cover 5 attached to an upper side of the case 3, covering the circuit board 4. The brake ECU 1 is an example of a liquid pressure control device.

Figure 5A:
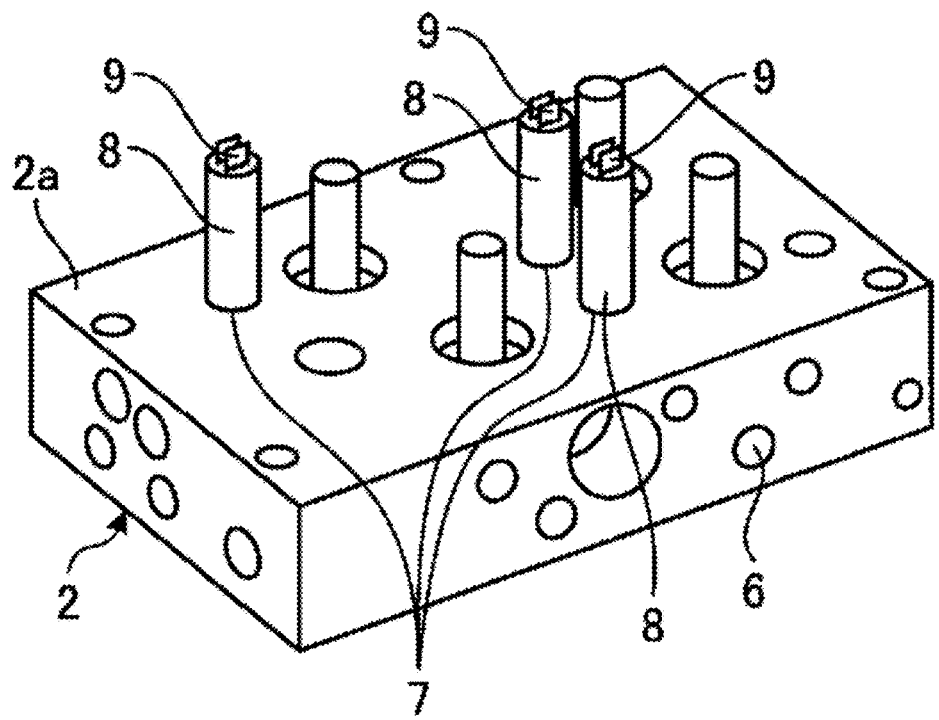
FIG. 5A is a perspective view illustrating a state in which a pressure sensor is attached to a housing constituting a liquid pressure control device according to the first embodiment.

First, structure of the brake ECU 1 will be specifically described. As illustrated in FIG. 5A, the housing 2 is formed in a rectangular parallelepiped shape, and is provided with an upper surface 2a serving as a first surface. The upper surface 2a is a plane that intersects a first direction and faces an upper direction being the first direction. The housing 2 is provided inside with a plurality of oil passages 6. The oil passages 6 are each an example of a fluid passage.

Figure 4:
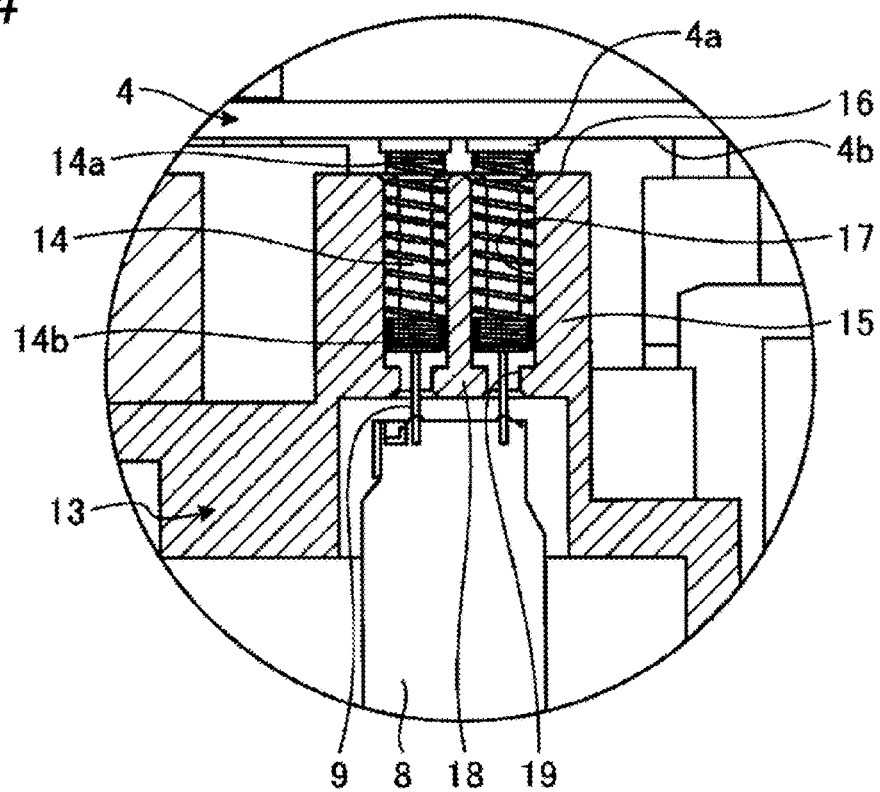
FIG. 4 is an enlarged cross-sectional view of a portion near a coil spring in FIG. 3.

As illustrated in FIGS. 3 and 5A, a holding hole 7 extends vertically, and a lower portion of a pressure sensor 8 is inserted into the holding hole 7 so that the pressure sensor 8 is attached to the housing 2. As illustrated in FIG. 3, the holding hole 7 is connected at its lower end portion to an oil passage 6, and hydraulic oil flows through the oil passage 6. The pressure sensor 8 is provided at its lower end with a sensor portion 8a that faces the oil passage 6, so that pressure of the hydraulic oil can be detected. As illustrated in FIG. 4, the pressure sensor 8 is also mounted on its upper end with two tabular terminals 9 protruding upward along a vertical direction. The pressure sensor 8 is an example of a sensor.

Figure 5B:
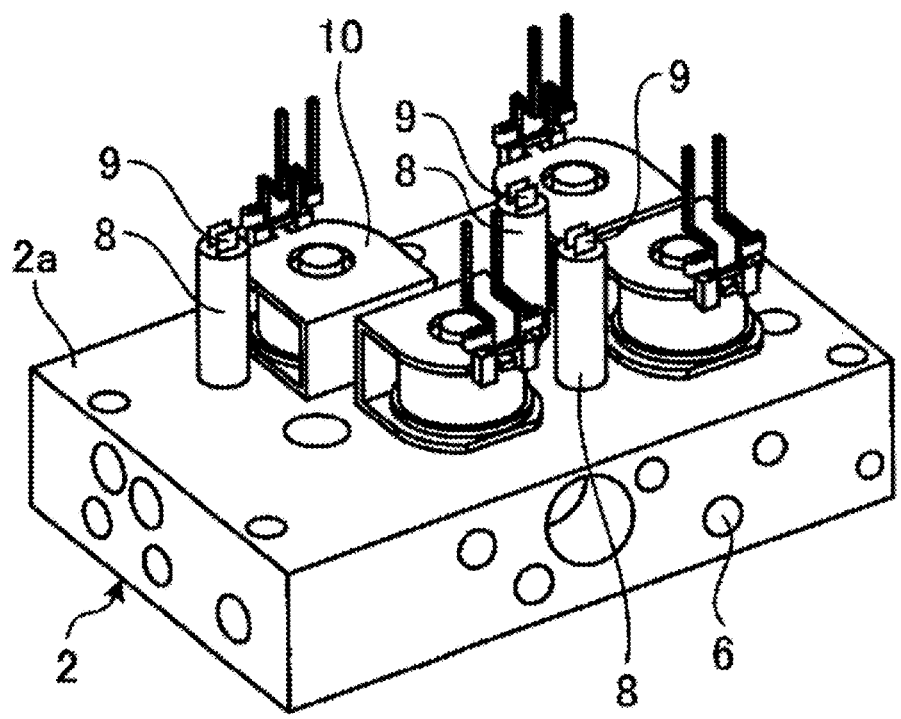
FIG. 5B is a perspective view illustrating a state in which a pressure sensor and a coil are attached to the housing constituting the liquid pressure control device according to the first embodiment.
Figure 10:
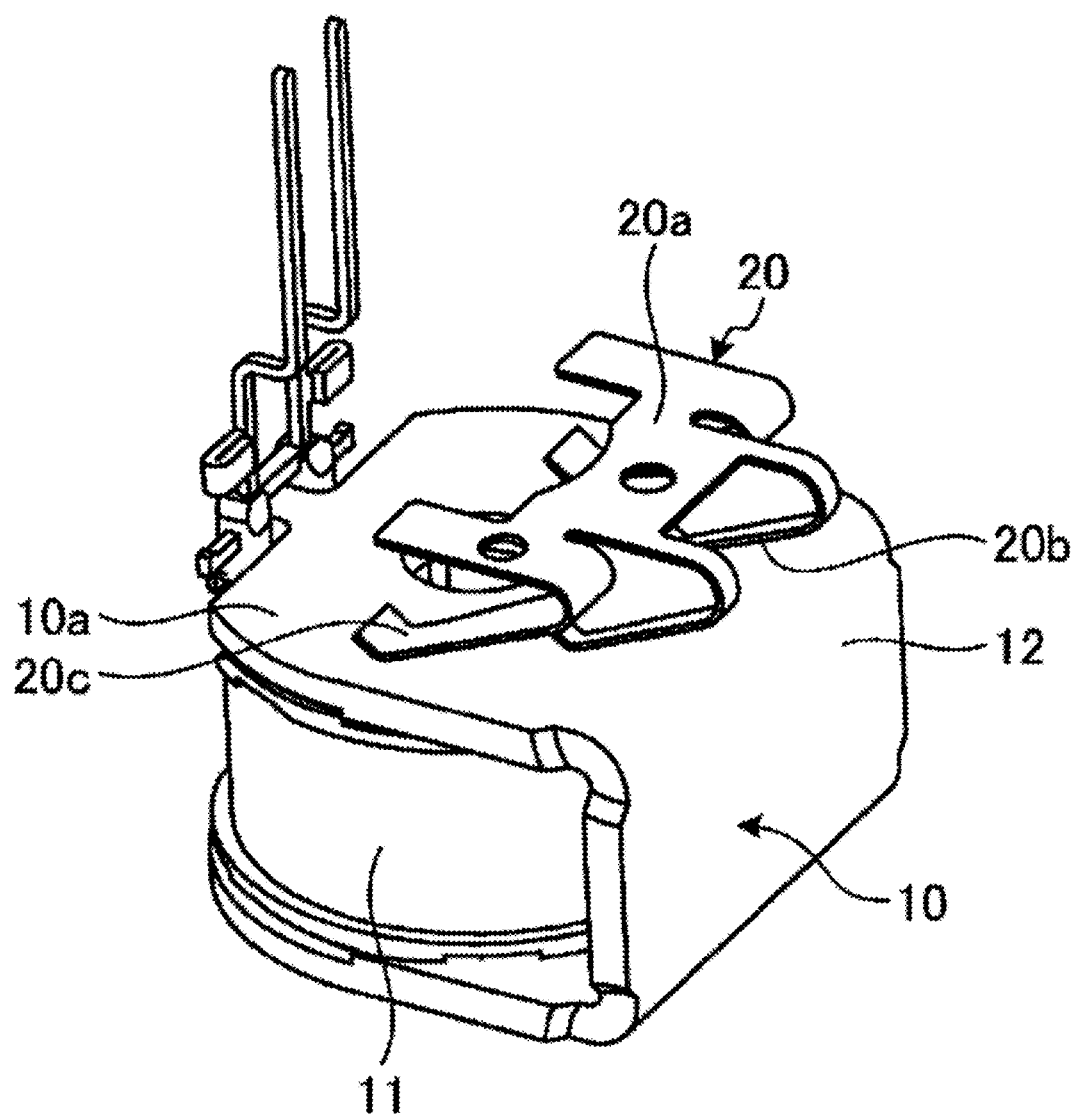
FIG. 10 is a perspective view illustrating a magnetized coil and a leaf spring according to the first embodiment.

As illustrated in FIG. 5B, the housing 2 is attached to its upper surface with a magnetized coil 10. As illustrated in FIG. 10, the magnetized coil 10 includes a cylindrical coil portion 11 and a yoke portion 12 covering an upper surface, a side surface, and a lower surface of the coil portion 11, and electrically drives a solenoid valve (not illustrated).

As illustrated in FIGS. 3 and 4, the case 3 includes a partition wall 13 that separates the housing 2 and the circuit board 4. In other words, the partition wall 13 is spaced from the upper surface 2a of the housing 2 in an upward direction and spreads in a lateral direction as a second direction intersecting the upward direction. In addition, a peripheral wall 3b (side wall) is provided in the periphery of the partition wall 13. The peripheral wall 3b extends vertically. The partition wall 13 is provided with a coil spring housing portion 15 for housing a coil spring 14, protruding upward. The coil spring housing portion 15 has an upper end surface 16 that is a part of an upper surface of the partition wall 13. The upper end surface 16 intersects the vertical direction and faces upward. The coil spring housing portion 15 has a recessed portion 17 recessed downward from the upper end surface 16 in a downward direction as a direction opposite to the first direction. The recessed portion 17 has a bottom wall 18 provided with through hole 19 that vertically passes through the bottom wall 18. The recessed portion 17 houses a coil spring 14.

The coil spring 14 is a so-called compression spring that can be elastically compressed vertically. The coil spring 14 has an upper end portion 14a being a first end portion that protrudes from the recessed portion 17 to be electrically connected to a land 4a of the circuit board 4. A lower end portion 14b being a second end portion is in contact with and electrically connected to a terminal 9 of the pressure sensor 8. That is, as illustrated in FIG. 4, the terminal 9 of the pressure sensor 8 passes through the through hole 19 provided in the bottom wall 18 of the recessed portion 17 to come into contact with the lower end portion 14b of the coil spring 14 and is electrically connected to the lower end portion 14b. The coil spring 14 is an example of a connection conductor.

Figure 6A:
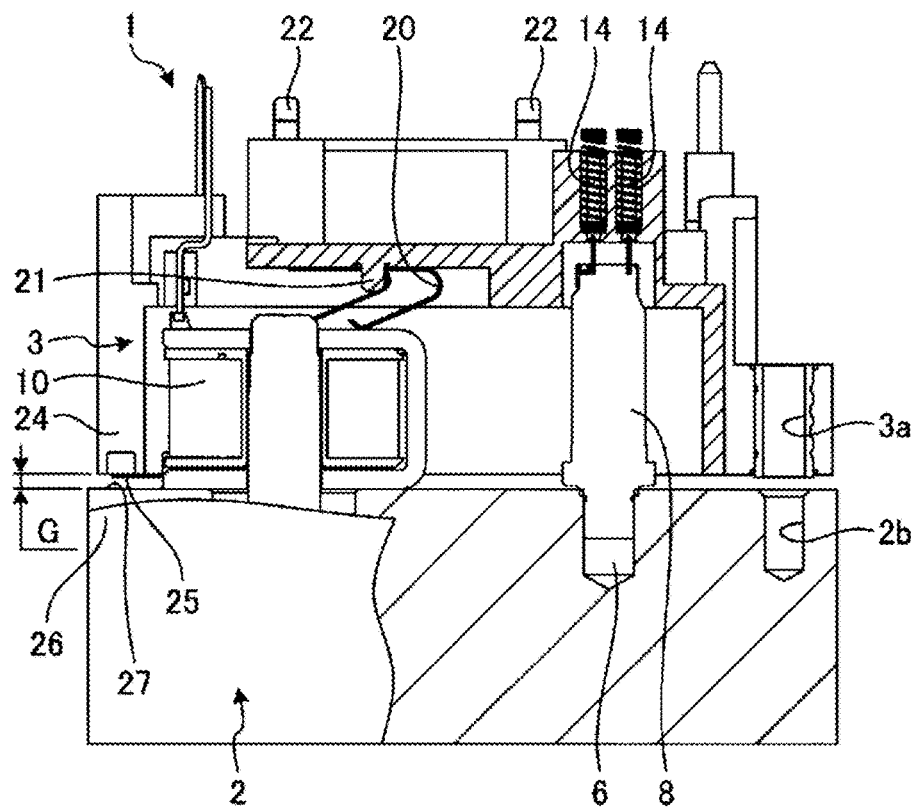
FIG. 6A is a cross-sectional view illustrating a state in which a case is placed on the housing according to the first embodiment, and is a cross-sectional view taken along line VIA-VIA in FIG. 5C.
Figure 11:
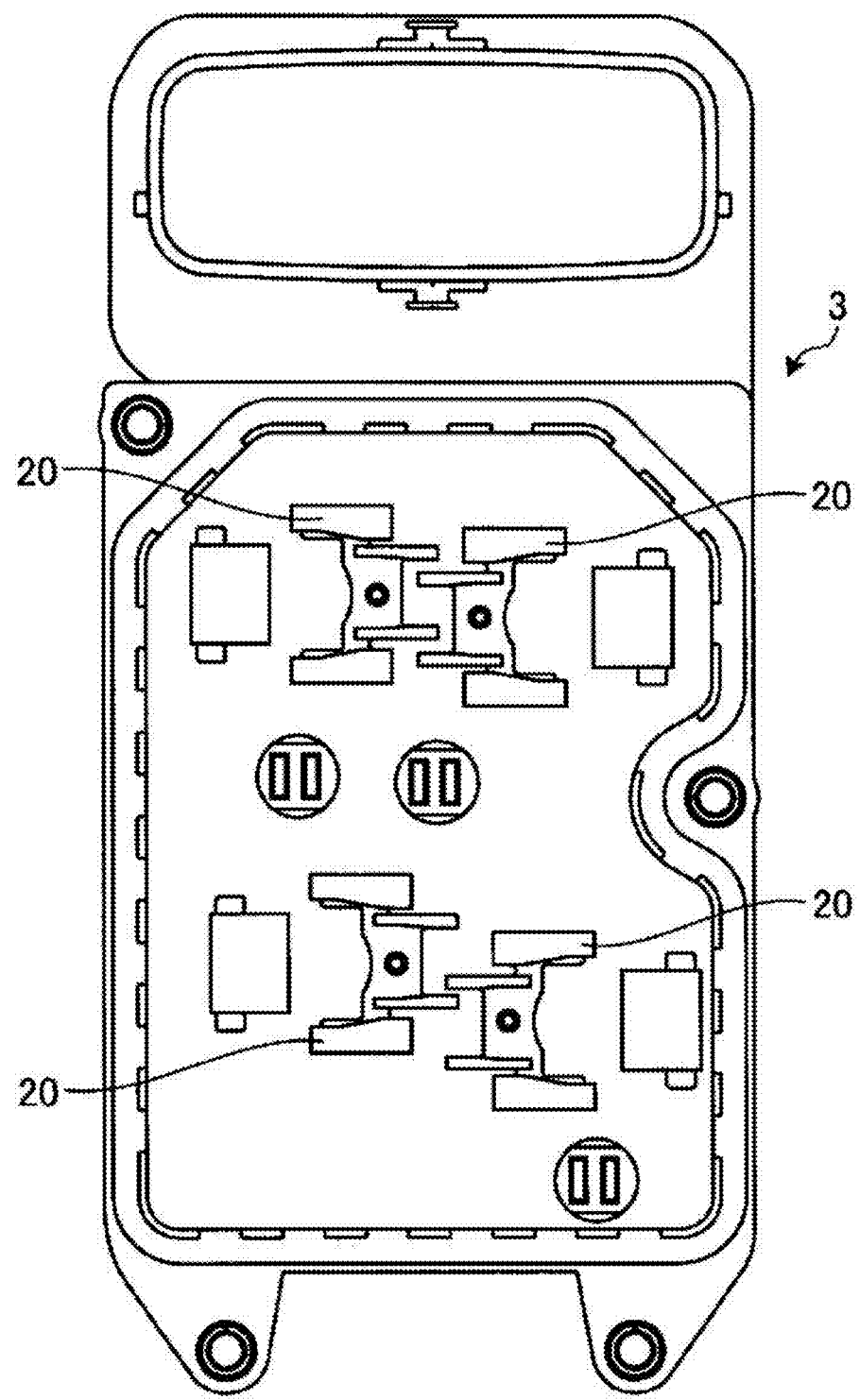
FIG. 11 is a rear view illustrating a lower surface of the case according to the first embodiment.

As illustrated in FIGS. 3, 10, and 11, four leaf springs 20 are attached to a lower surface of the case 3. Specifically, the four leaf springs 20 are disposed surrounding a central portion of a lower surface 3c of the case 3. In the present embodiment, the leaf spring 20 is an example of a deformable part positioned in a deformed state between the housing 2 and the case 3 in an assembled state in which the housing 2 and the case 3 are assembled. As illustrated in FIG. 10, the leaf spring 20 integrally includes a base portion 20a fixed to the lower surface of the case 3, a first spring portion 20b that is bent from a lateral inside of the base portion 20a and extends obliquely downward, and a second spring portion 20c that is bent from a lateral outside of the base portion 20a and extends obliquely downward. The leaf spring 20 presses an upper surface 10a of a magnetized coil 10. As illustrated in FIG. 6A, the leaf spring 20 is fixed to a protrusion 21 of the case 3. The leaf spring 20 is an example of the deformable part and a support part.

As illustrated in FIGS. 2, 3, and 4, the circuit board 4 extends laterally. The circuit board 4 includes a third surface being a connection surface 4b vertically facing the upper end surface 16 of the case 3, and the land 4a provided on the connection surface 4b, and constitutes a liquid pressure control circuit together with an electronic component (not illustrated) mounted on the circuit board 4. As illustrated in FIGS. 2 and 3, the circuit board 4 is held by the case 3 with a snap fit 22. The snap fit 22 will be described in detail later. As illustrated in FIG. 3, the case 3 and the housing 2 are fixed with a mounting bolt 23.

Next, procedure for assembling the brake ECU 1 will be described. First, as illustrated in FIG. 5A, the pressure sensor 8 is attached to the housing 2 by press-fitting the pressure sensor 8 into the holding hole 7 of the housing 2. Next, as illustrated in FIG. 5B, the magnetized coil 10 is mounted on an upper surface of the housing 2.

Figure 5C:
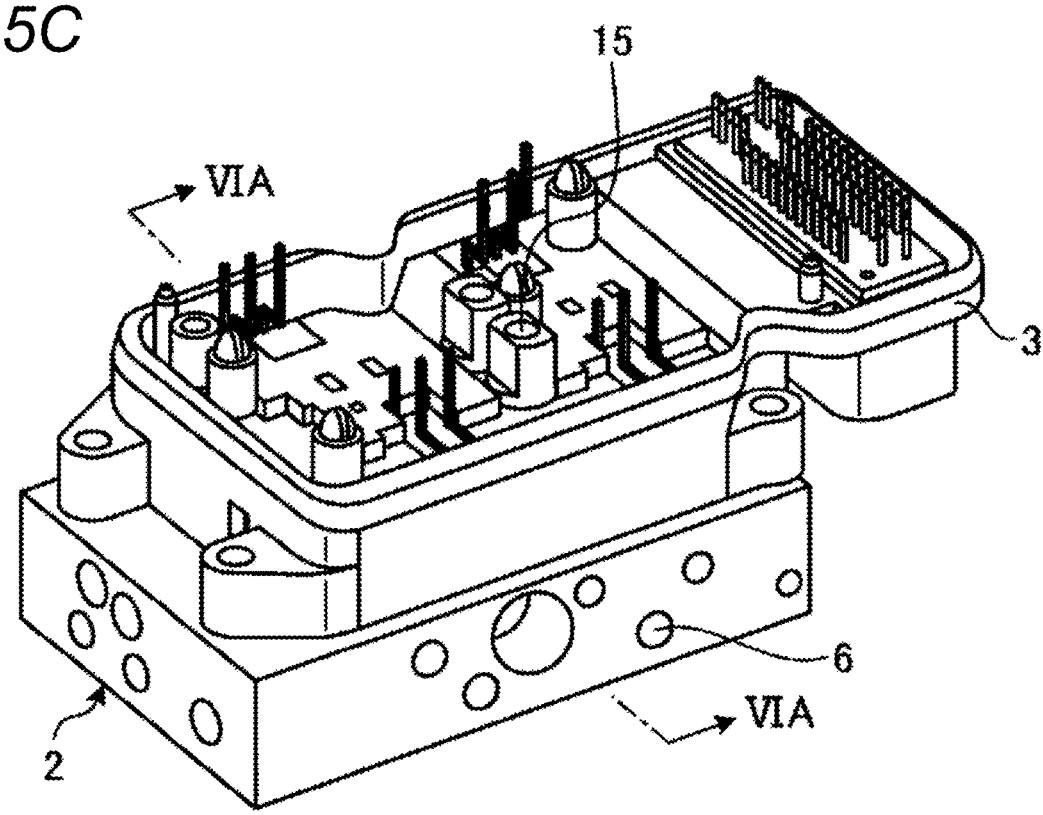
FIG. 5C is a perspective view illustrating a state in which a case is placed on the housing according to the first embodiment.

Then, as illustrated in FIG. 5C, after the coil spring 14 is housed in the coil spring housing portion 15 of the case 3, the case 3 is placed on the housing 2. At this time, as illustrated in FIG. 6A, a gap G along the vertical direction is provided between a lower surface 25 of a peripheral portion 24 of the case 3 and an upper surface 27 of a peripheral portion 26 of the housing 2. This is because the leaf spring 20 supports the case 3 upward with respect to the housing 2.

Figure 5D:
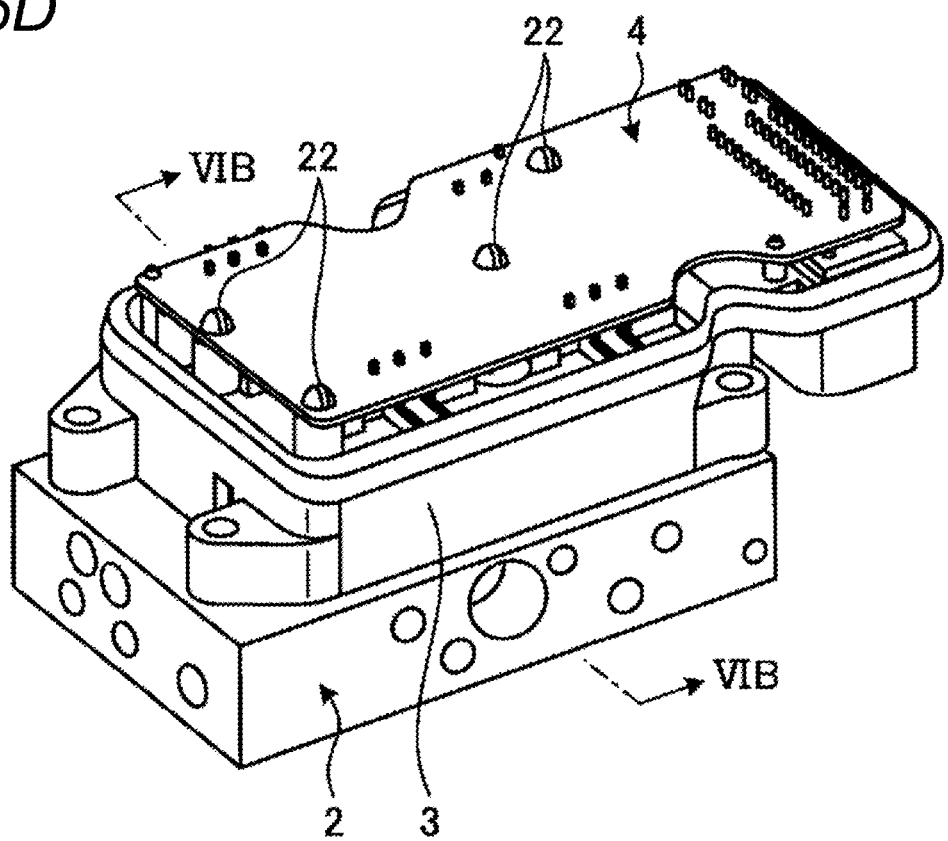
FIG. 5D is a perspective view illustrating a state in which a circuit board is held in the case according to the first embodiment.
Figure 6B:
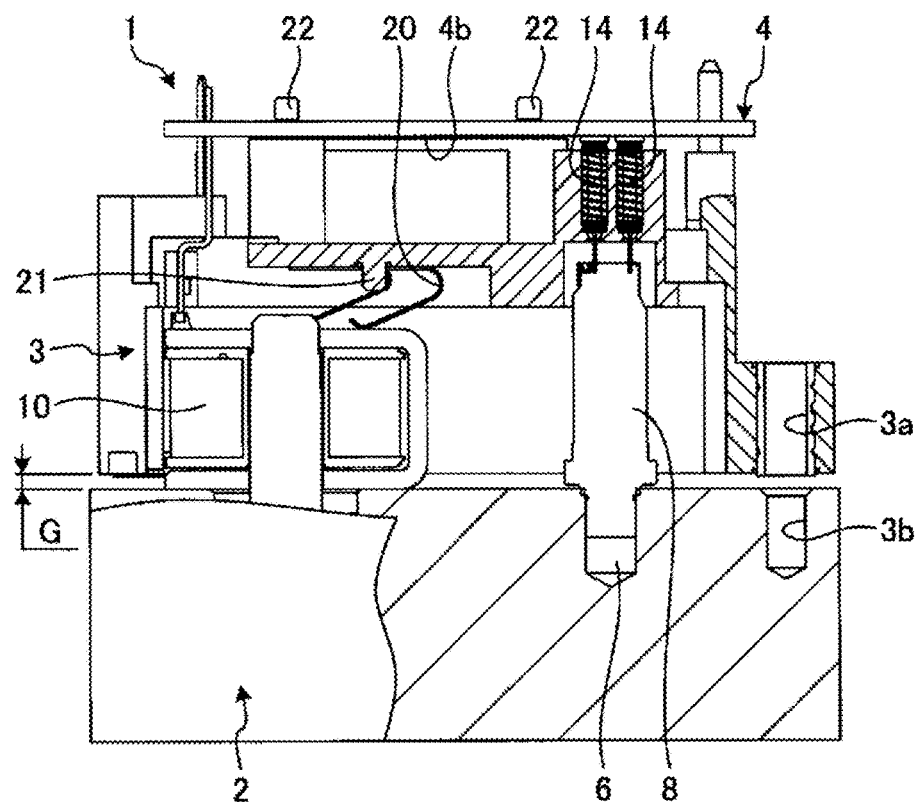
FIG. 6B is a cross-sectional view illustrating a state in which a circuit board is held in the case according to the first embodiment, and is a cross-sectional view taken along line VIB-VIB in FIG. 5D.
Figure 7:
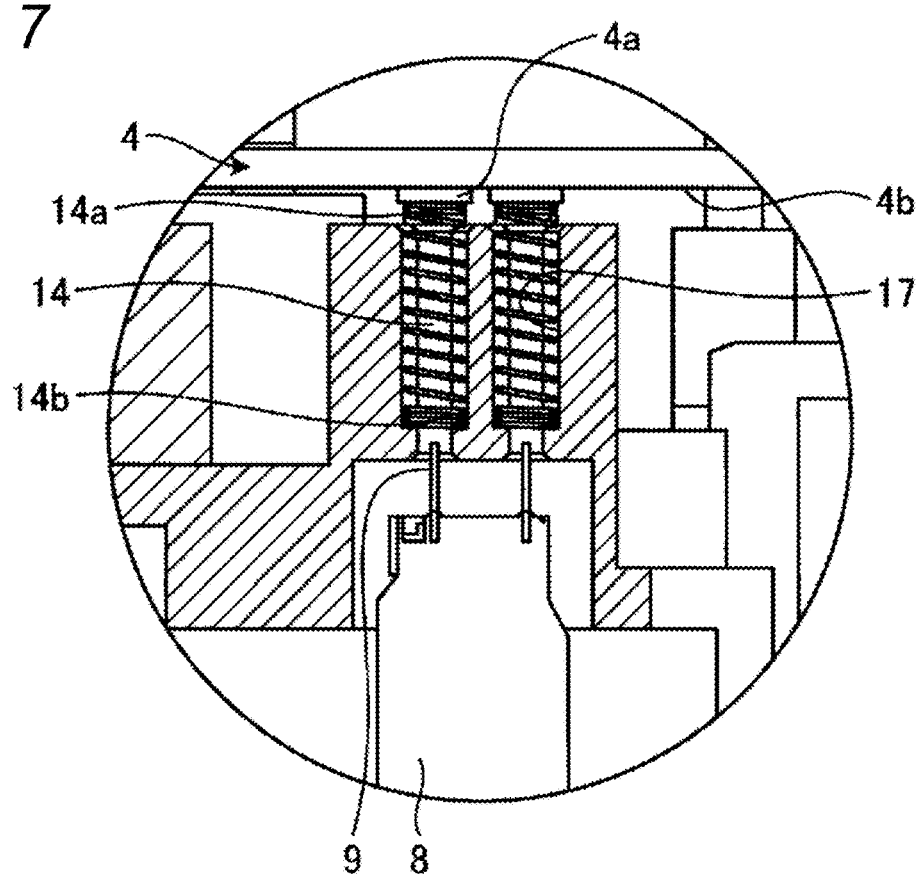
FIG. 7 is an enlarged cross-sectional view of a portion near a coil spring in FIG. 6B.
Figure 9A:
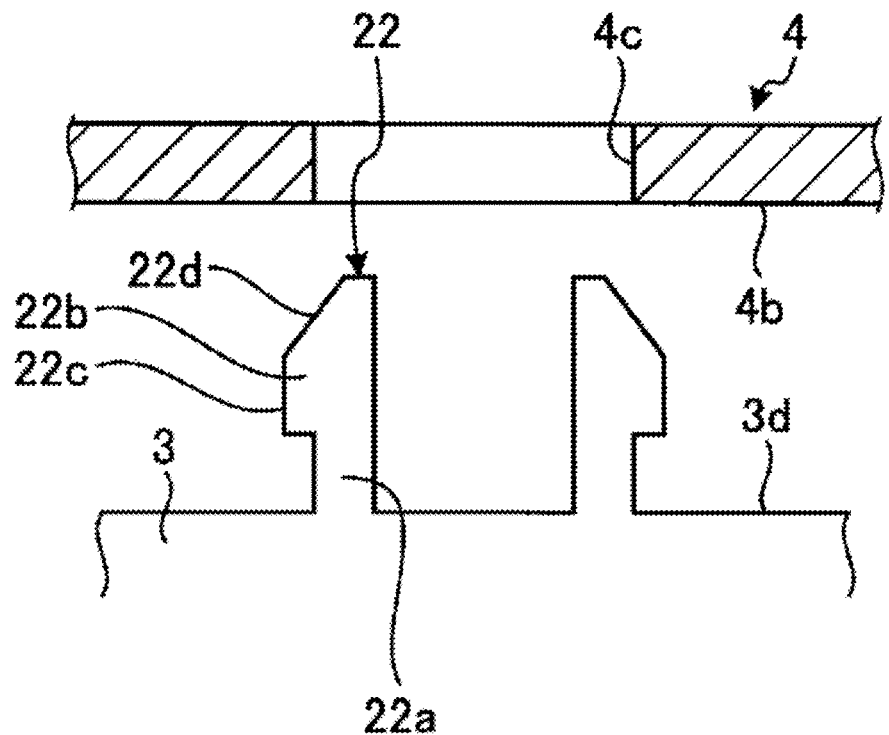
FIG. 9A is an enlarged cross-sectional view illustrating a state before a circuit board is attached to a snap fit according to the first embodiment.
Figure 9B:
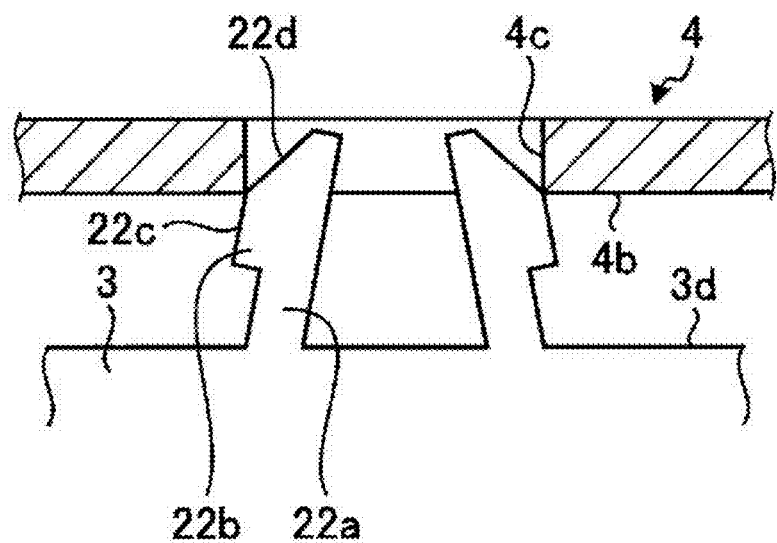
FIG. 9B is an enlarged cross-sectional view illustrating an initial stage of inserting the snap fit according to the first embodiment into a fitting hole of the circuit board.
Figure 9C:
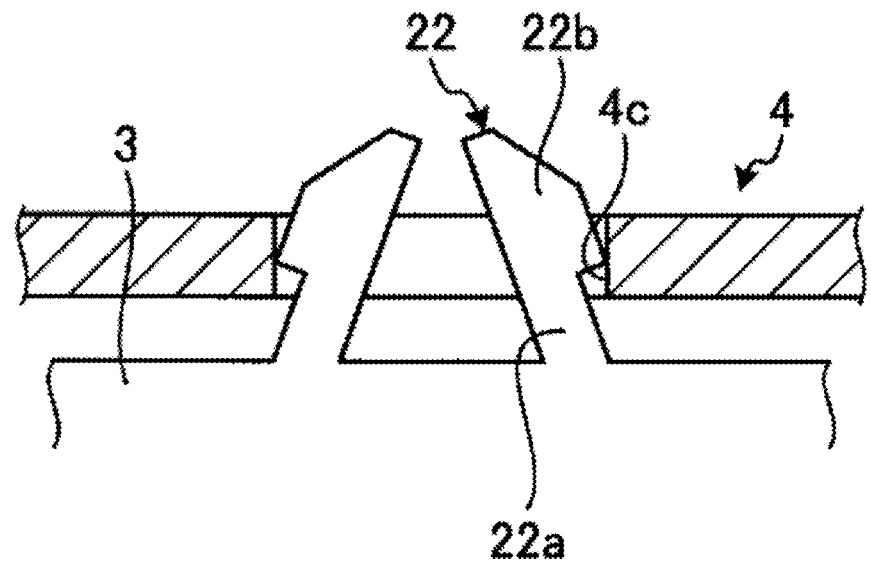
FIG. 9C is an enlarged cross-sectional view illustrating an intermediate stage of inserting the snap fit into the fitting hole of the circuit board according to the first embodiment.
Figure 9D:
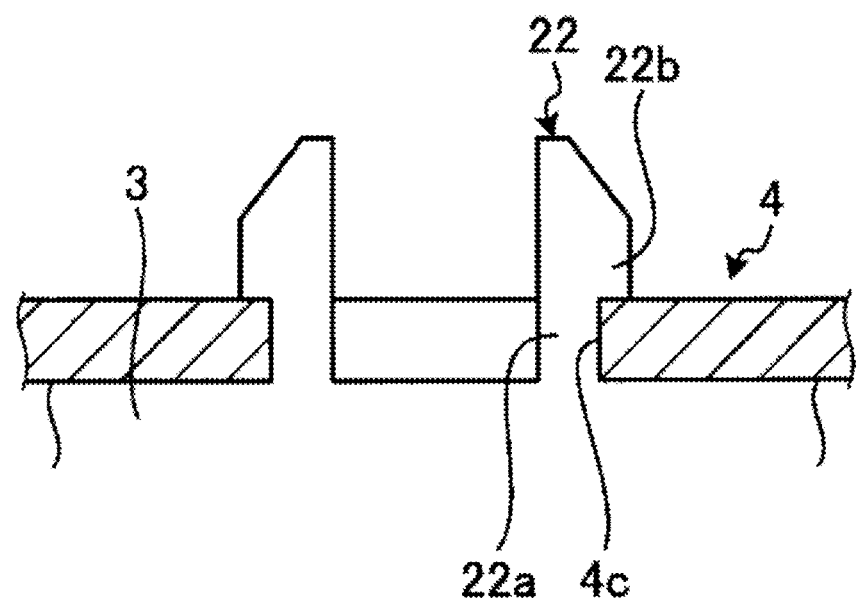
FIG. 9D is an enlarged cross-sectional view illustrating a stage of holding the circuit board by inserting the snap fit into the fitting hole of the circuit board according to the first embodiment.

Next, as illustrated in FIGS. 5D and 6B, when the circuit board 4 is pressed down toward the case 3, the circuit board 4 is held in the case 3 with the snap fit 22 provided in the case 3. Here, as illustrated in FIG. 9A, the circuit board 4 is provided with a substantially circular fitting hole 4c held by the snap fit 22, and the case 3 is provided with a pair of the snap fits 22 protruding upward. The snap fit 22 integrally includes a base portion 22a that extends upward from the upper surface 3d of the case 3 and that is elastically deformable, and a protruding elastic holding portion 22b provided in a leading end of the base portion 22a. The elastic holding portion 22b has a vertical surface 22c and an inclined surface 22d provided above the vertical surface 22c. The inclined surface 22d is provided in a so-called tapered shape approaching the center of the fitting hole 4c as extending upward. When the circuit board 4 is lowered downward, as illustrated in FIG. 9B, an inner peripheral surface of the fitting hole 4c comes into contact with the inclined surface 22d of the elastic holding portion 22b and the base portion 22a of each of the snap fits 22 is elastically deformed to cause the right and left snap fits 22 to approach each other. When the circuit board 4 is further pressed downward, as illustrated in FIG. 9C, the lower end of the vertical surface 22c of the elastic holding portion 22b comes into contact with the inner peripheral surface of the fitting hole 4c to cause the snap fit 22 to have a maximum amount of deflection. At this time, the load pressing the circuit board 4 downward becomes maximum, and this pressing load is defined as a first load (first compressive load in the vertical direction). Then, when the circuit board 4 is further pressed downward, the snap fit 22 returns to a state with a small deflection, and the circuit board 4 is held by the snap fit 22, as illustrated in FIG. 9D. The upper end portion 14a of the coil spring 14 is in contact with and electrically connected to the land 4a of the circuit board 4. In a process of pressing the circuit board 4 against the case 3, the leaf spring 20 has a spring constant significantly larger than that of the snap fit 22, so that a state with a gap provided between a leading end of the terminal 9 and the lower end portion 14b of the coil spring 14 is maintained as illustrated in FIG. 7. As described above, the snap fit 22 has a structure with the elastic holding portion 22b that is elastically deformed by the first load and moves the circuit board 4 to a holding position to hold the circuit board 4 at the holding position. The snap fit 22 is an example of an elasticity retention mechanism.

That is, when the first load is applied to the leaf spring 20 in a non-assembled state in which the case 3 is further spaced upward from the housing 2 than in an assembled state in which the housing 2 and the case 3 are assembled, the leaf spring 20 enables the housing 2 and the case 3 to be in a separation state in which the lower end portion 14b supported by the bottom wall 18 is spaced upward from the terminal 9.

When a second load (second compression load in the vertical direction) larger than the first load is applied downward to the leaf spring 20 in the non-assembled state, the leaf spring 20 is deformed by the second load to cause the housing 2 and the case 3 to be in contact with each other and a relative position between the lower end portion 14b and the terminal 9 to be changed. This enables a contact state in which the lower end portion 14b and the terminal 9 are in contact with each other.

Figure 5E:
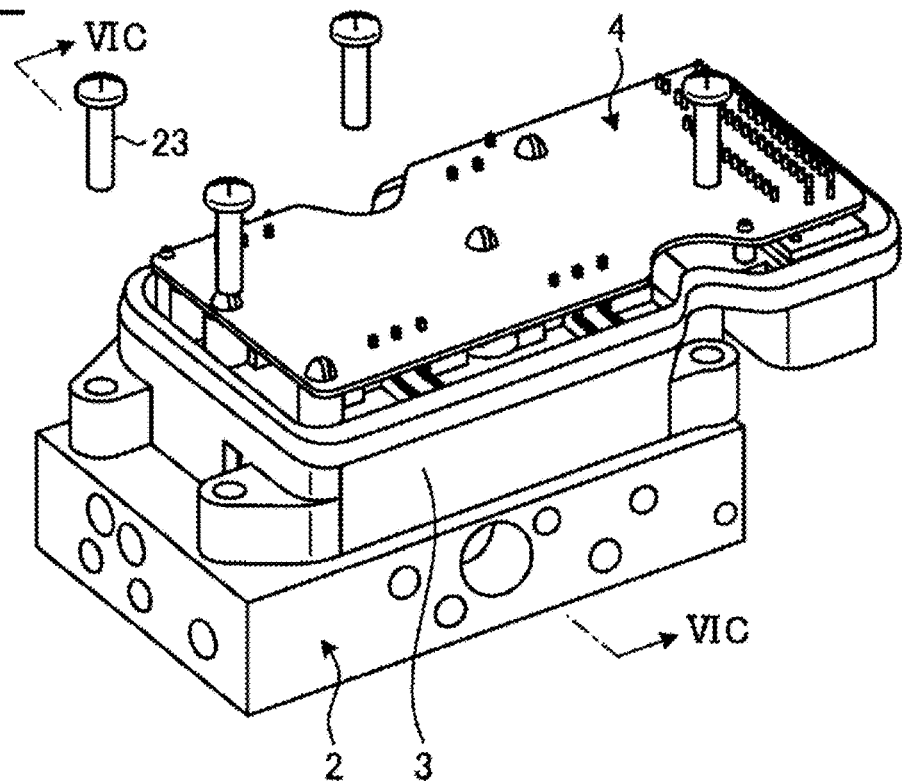
FIG. 5E is a perspective view illustrating a state in which a case is assembled into the housing according to the first embodiment.
Figure 5F:
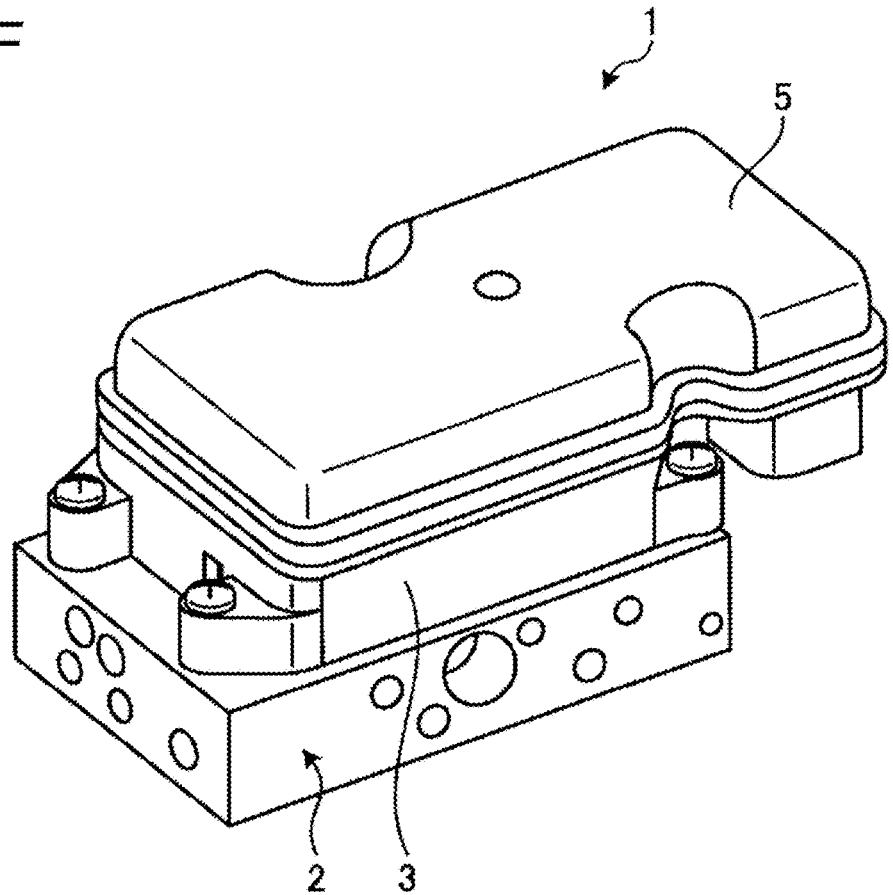
FIG. 5F is a perspective view illustrating a state in which a cover is assembled into the housing according to the first embodiment.
Figure 6C:
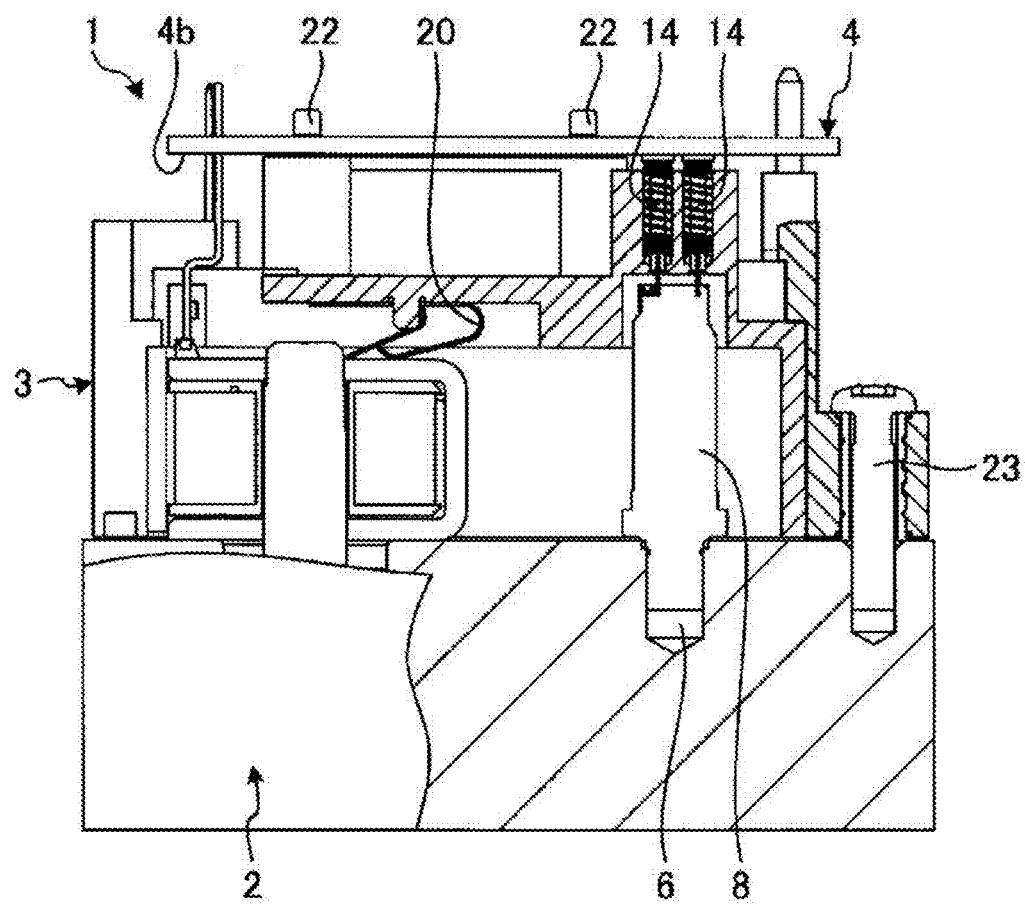
FIG. 6C is a cross-sectional view illustrating a state in which a case is assembled into the housing according to the first embodiment, and is a cross-sectional view taken along line VIC-VIC in FIG. 5E.
Figure 8:
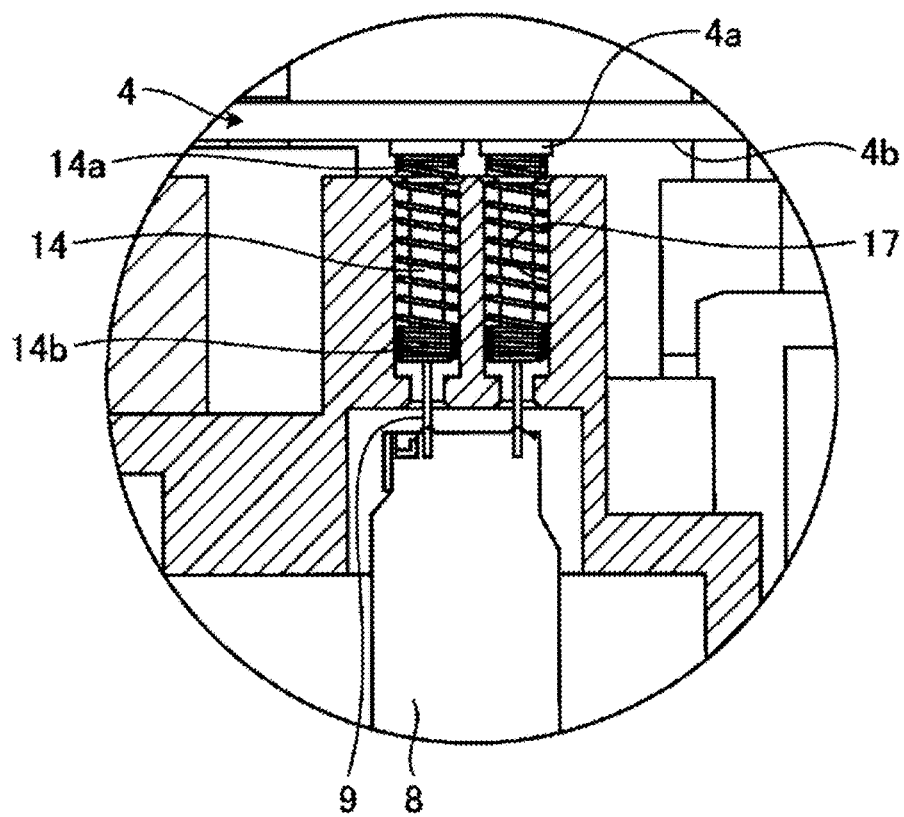
FIG. 8 is an enlarged cross-sectional view of a portion near a coil spring in FIG. 6C.

Next, as illustrated in FIG. 5E, the circuit board 4 is pressed toward the case 3 with the second load larger than the first load. Then, as illustrated in FIG. 6C, the leaf spring 20 is compressed vertically and elastically deformed, so that a lower surface of a peripheral portion of the case 3 comes into contact with an upper surface of a peripheral portion of the housing 2. While this state is maintained, the case 3 is fixed to the housing 2 with the mounting bolt 23 as illustrated in FIG. 6C. Specifically, the mounting bolt 23 is inserted into bolt holes 2b and 3a, and is fastened. As illustrated in FIG. 8, the terminal 9 of the pressure sensor 8 passes through the through hole 19, and comes into contact with the lower end portion 14b of the coil spring 14 to be electrically connected to the lower end portion 14b. Finally, as illustrated in FIG. 5F, the cover 5 is attached and assembly work of the brake ECU 1 is completed.

As described above, in the present embodiment, the circuit board 4 can be assembled into the case 3 in a state in which the terminal 9 is not in contact with the lower end portion 14b of the coil spring 14. This enables avoiding an event when the circuit board 4 is assembled into the case 3, in which the coil spring 14 is pushed upward relatively by the terminal 9 of the pressure sensor 8 to partially come out of the recessed portion 17 and fall due to the case 3 approaching the housing 2. In addition, a groove is not required to be processed in the terminal 9 of the pressure sensor 8, and a spherical portion is not required to be provided in the terminal 9. Accordingly, manufacturing effort and cost can be further reduced.

In the brake ECU 1 described above, for example, the leaf spring 20 is an elastic member that is elastically deformed in the assembled state. Thus, according to this kind of structure, for example, the case 3 can be elastically supported even when an external force such as vibration acts on the brake ECU 1. In addition, the land 4a provided on the circuit board 4 and the terminal 9 of the pressure sensor 8 are in elastic contact with each other using the coil spring 14, so that a stable connection can be maintained even when an external force is applied.

In the brake ECU 1 described above, for example, four leaf springs 20 are provided spaced apart from each other in the lateral direction intersecting the upward direction. Thus, according to this kind of structure, for example, when the circuit board 4 is pressed against the case 3, the circuit board 4 is assembled into the housing 2 while inclination of the case 3 is suppressed.

In the brake ECU 1 described above, for example, the leaf spring 20 is positioned between the magnetized coil 10 provided on the upper surface 2a of the housing 2 and the partition wall 13 of the case 3. Thus, according to this kind of structure, for example, the leaf spring 20 can be further downsized to reduce cost and weight.

The present embodiment also includes a first step of applying a first load to the snap fit 22 to hold the circuit board 4 by the snap fit 22 by pressing the circuit board 4 against the case 3 downward, while the case 3 is supported upward by the leaf spring 20, to cause a separation state in which the case 3 is further spaced from the housing 2 upward than in an assembled state in which the housing 2 and the case 3 are assembled, and in which the lower end portion 14b supported by the bottom wall 18 is spaced from the terminal 9 upward; and a second step of causing the case 3 to approach the housing 2 in the downward direction with the circuit board 4 held by the snap fit 22 to assemble the housing 2 and the case 3. As described above, when the circuit board 4 is pressed, the lower end portion 14b of the coil spring 14 is spaced upward from the terminal 9. This enables avoiding an event when the circuit board 4 is assembled into the case 3, in which the coil spring 14 is pushed upward relatively by the terminal 9 of the pressure sensor 8 to come out of the recessed portion 17 and fall due to the case 3 approaching the housing 2.

Second Embodiment

In a brake ECU 1A according to a second embodiment, a resin spring 120 is applied instead of the leaf spring 20 of the first embodiment.

Figure 12A:
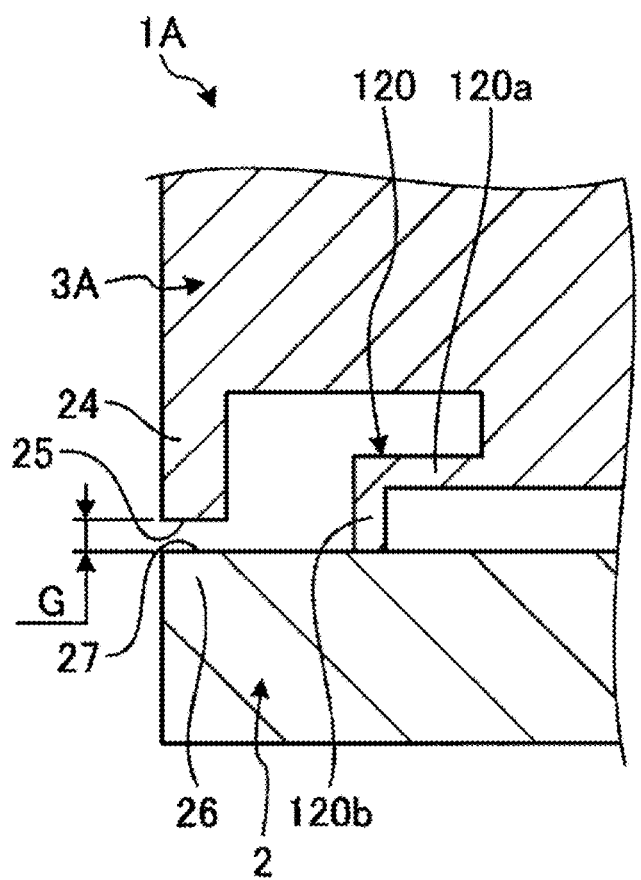
FIG. 12A is an enlarged cross-sectional view of a state in which a case is placed on a housing according to a second embodiment as viewed from laterally.

That is, as illustrated in FIG. 12A, the resin spring 120 according to the present embodiment is an elastic member and is bent in an L shape as viewed from laterally. Specifically, the resin spring 120 is provided inside a peripheral portion 24 of a case 3A, and the resin spring 120 integrally includes a base portion 120a that extends in the lateral direction and an elastic portion 120b that is bent at a leading end of the base portion and extends downward. A gap G along the vertical direction is provided between a lower surface 25 of a peripheral portion 24 of the case 3A and an upper surface 27 of a peripheral portion 26 of a housing 2. This is because the case 3A is supported upward with respect to the housing 2 by the resin spring 120. The resin spring 120 is an example of a deformable part and a support part.

Even in the second embodiment, the gap G is provided when the first load is applied to the case 3A.

Figure 12B:
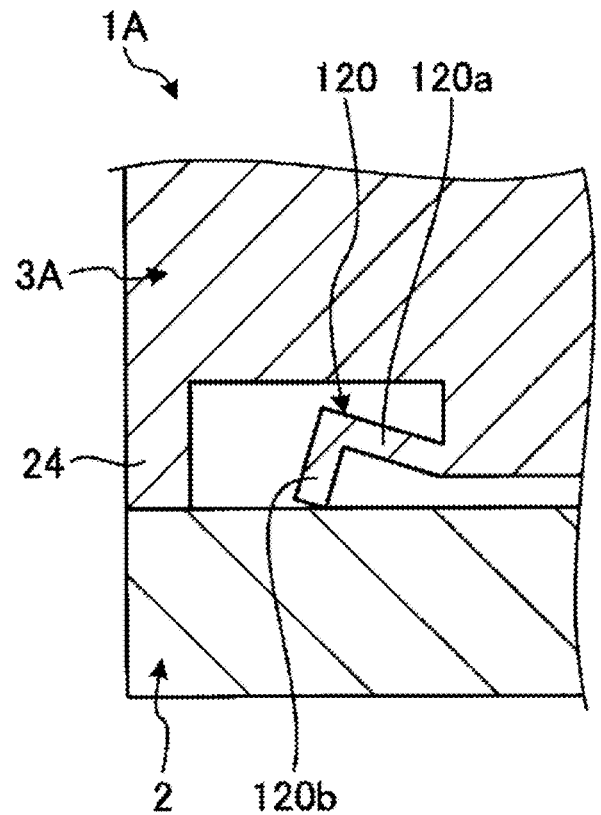
FIG. 12B is an enlarged cross-sectional view of a state in which the case is assembled into the housing according to the second embodiment as viewed from laterally.

When the second load is applied to the case 3A, the resin spring 120 is elastically deformed from the base portion 120a, and the lower surface 25 of the peripheral portion 24 of the case 3A and an upper surface 27 the peripheral portion 26 of the housing 2 come into contact with each other, as illustrated in FIG. 12B.

As described above, the resin spring 120 is applied in the present embodiment, so that the resin spring 120 can be integrally formed with the case 3A when the case 3A is made of the same resin. Thus, for example, the number of components may be reduced, and manufacturing effort and cost may be reduced.

Third Embodiment

In a brake ECU 1B according to a third embodiment, a deformable pin 220 is applied as a deformable part and a support part.

Figure 13A:
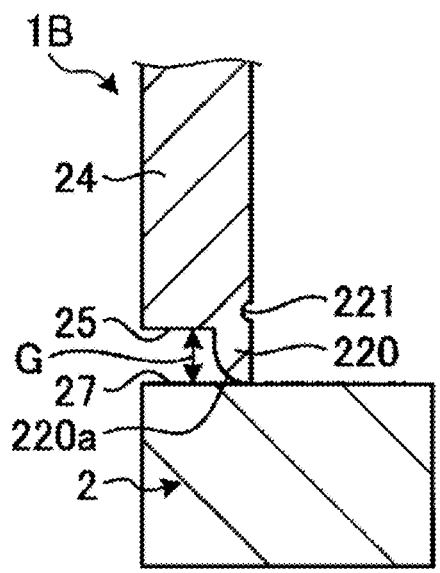
FIG. 13A is an enlarged cross-sectional view of a state in which a case is placed on a housing according to a third embodiment as viewed from laterally.

As illustrated in FIG. 13A, the deformable pin 220 according to the present embodiment is a plastically deformable member. Specifically, there is provided the deformable pin 220 extending downward from a lower surface 25 of a peripheral portion 24 of a case. The deformable pin 220 is provided in its lower portion with a curved surface 220a. The deformable pin 220 is also provided in its root portion with a notch 221. The notch 221 functions as a fragile portion (easy deformable part) allowing the deformable pin 220 to be easily folded.

A gap G along the vertical direction is provided between the lower surface 25 of the peripheral portion 24 of the case and an upper surface 27 of a peripheral portion of a housing 2. This is because the case is supported upward with respect to the housing 2 by the deformable pin 220. The deformable pin 220 is an example of a deformable part and a support part.

Even in the third embodiment, the gap G is provided when the first load is applied to the case.

Figure 13B:
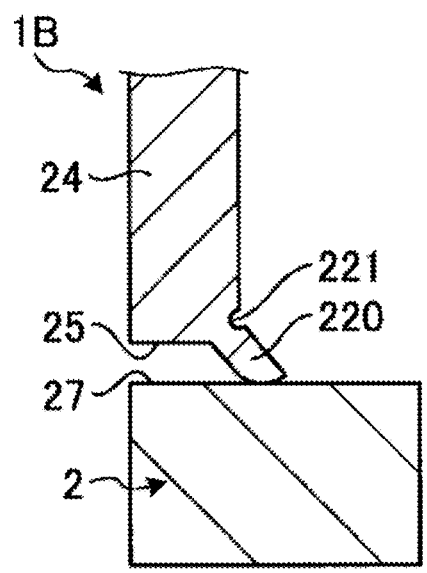
FIG. 13B is an enlarged cross-sectional view of an intermediate state in which the case is pressed downward against the housing according to the third embodiment as viewed from laterally.
Figure 13C:
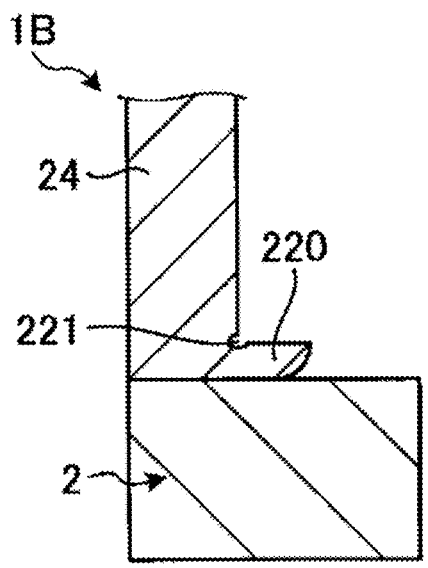
FIG. 13C is an enlarged cross-sectional view illustrating a cross section in which the case is assembled into the housing according to the third embodiment.

When the second load is applied to the case, the deformable pin 220 is folded from the root portion starting from the notch 221 and plastically deformed, and then the lower surface 25 of the peripheral portion 24 of the case 3 and the upper surface 27 of the peripheral portion of the housing 2 come into contact with each other, as illustrated in FIGS. 13B and 13C.

As described above, the deformable pin 220 is applied in the present embodiment, so that the deformable pin 220 can be molded with a relatively simple structure. When the deformable pin 220 is made of the same resin as that of the case, the deformable pin 220 can be integrally molded with the case. In this case, for example, the number of components may be reduced, and manufacturing effort and cost may be reduced.

Fourth Embodiment

In a brake ECU 1C according to a fourth embodiment, a press-fit pin 320 is applied as a support part.

Figure 14A:
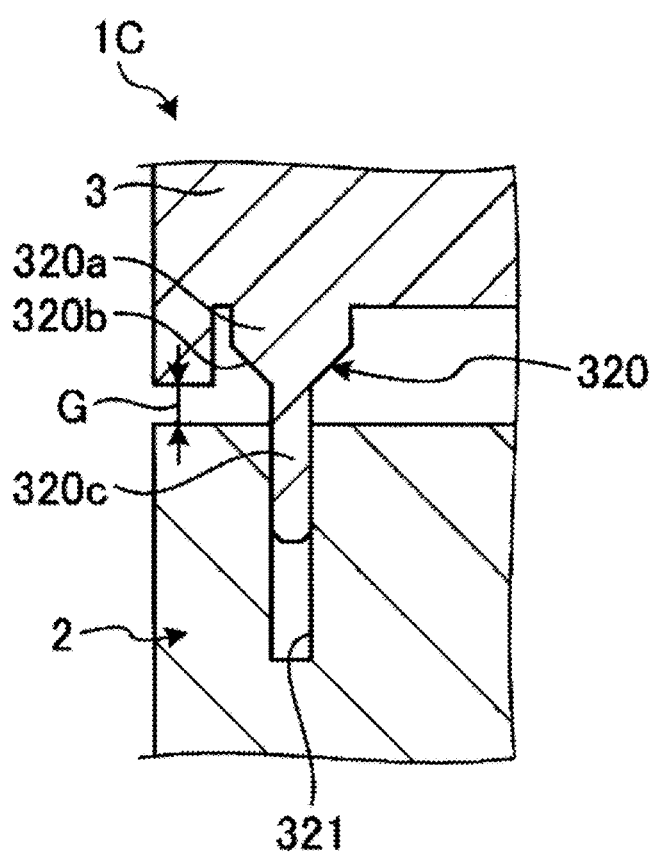
FIG. 14A is an enlarged cross-sectional view of a state in which a case is placed on a housing according to a fourth embodiment as viewed from laterally.

As illustrated in FIG. 14A, in the present embodiment, the press-fit pin 320 is fixed to a lower portion of a case 3, and a housing 2 is provided with a press-fit hole 321 into which the press-fit pin 320 is press-fitted. The press-fit pin 320 integrally includes a large-diameter portion 320a fixed to the case 3, an enlarged-diameter portion 320b provided below the large-diameter portion 320a, and a small-diameter portion 320c that is press-fitted into the press-fit hole 321. The press-fit hole 321 has a diameter that is set slightly smaller than a diameter of the small-diameter portion 320c of the press-fit pin 320.

A gap G along the vertical direction is provided between a lower surface of a peripheral portion of the case 3 and an upper surface of a peripheral portion of a housing 2. This is because the case 3 is supported upward with respect to the housing 2 by the press-fit pin 320.

Even in the fourth embodiment, the gap G is provided when the first load is applied to the case 3.

Figure 14B:
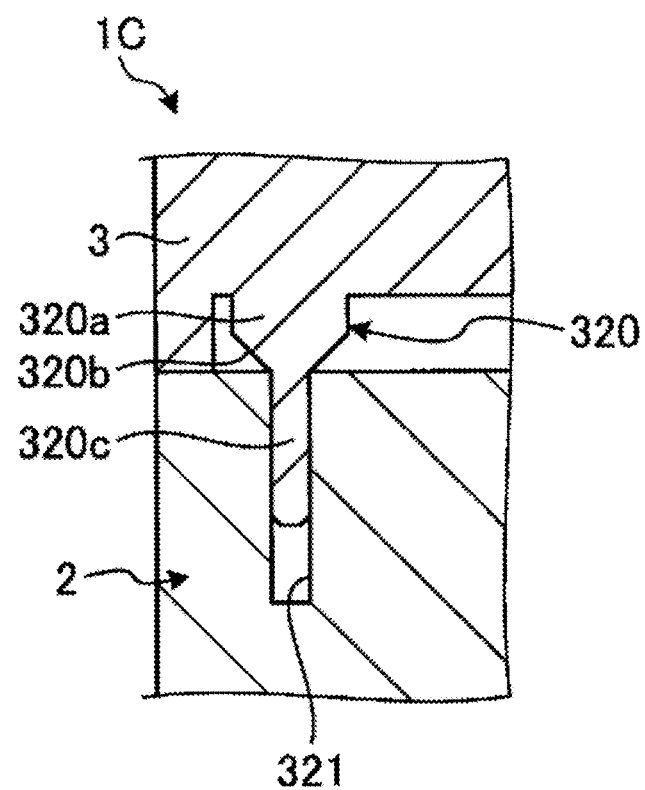
FIG. 14B is an enlarged cross-sectional view of the state in which the case is assembled into the housing according to the fourth embodiment as viewed from laterally.

When the second load is applied to the case 3, the press-fit pin 320 is press-fitted into the press-fit hole 321, and the lower surface of the peripheral portion of the case 3 and the upper surface the peripheral portion of the housing 2 come into contact with each other, as illustrated in FIG. 14B.

As described above, in the present embodiment, the press-fit pin 320 is applied, so that press-fitting force can be easily adjusted by appropriately changing the diameter of the small-diameter portion 320c of the press-fit pin 320 with respect to the diameter of the press-fit hole 321.

Fifth Embodiment

In a brake ECU 1D according to a fifth embodiment, a protruding portion 420 provided in a case 3 is applied as a support part.

Figure 15A:
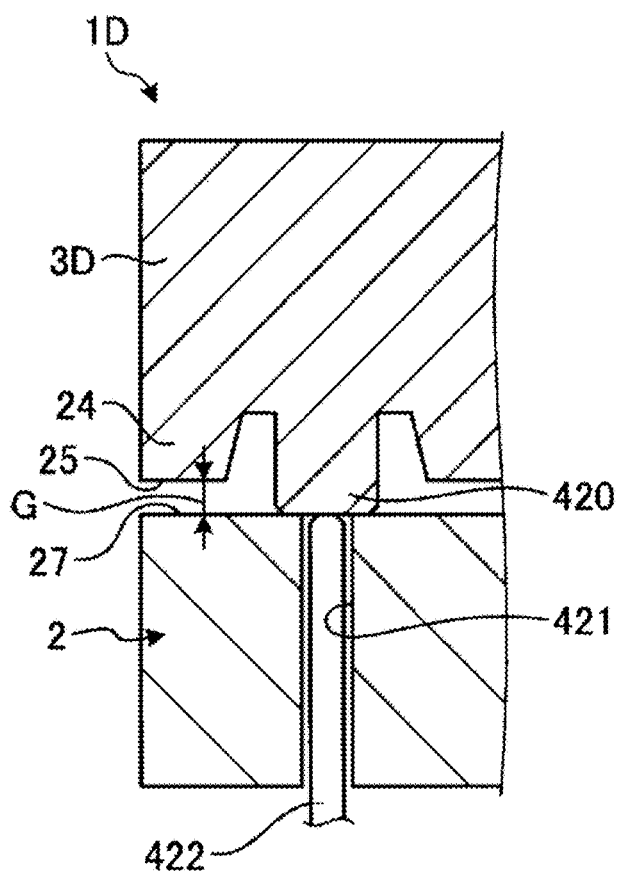
FIG. 15A is an enlarged cross-sectional view of a state in which a case is placed on a housing according to a fifth embodiment as viewed from laterally.

As illustrated in FIG. 15A, in the present embodiment, the protruding portion 420 is integrally provided in a lower portion of a case 3D, an insertion hole 421 extending in the vertical direction is provided in a housing 2, and a heating pin 422 is housed inside the insertion hole 421. The protruding portion 420 is made of thermoplastic resin bulged downward. The heating pin 422 is heated and movable upward. The heating pin 422 is an example of a support part.

A gap G along the vertical direction is provided between a lower surface 25 of a peripheral portion 24 of the case 3D and an upper surface 27 of a peripheral portion of a housing 2. This is because the case 3D is supported upward with respect to the housing 2 by the protruding portion 420.

Even in the fifth embodiment, the gap G is provided when the first load is applied to the case 3D, as illustrated in FIG. 15A.

Figure 15B:
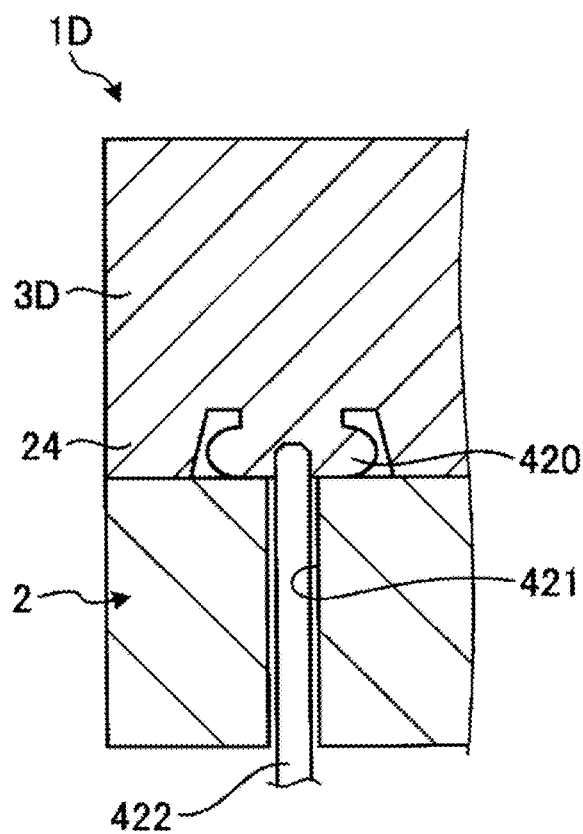
FIG. 15B is an enlarged cross-sectional view of the state in which the case is assembled into the housing according to the fifth embodiment as viewed from laterally.

As illustrated in FIG. 15B, when the heating pin 422 is heated and moved upward, the protruding portion 420 is deformed by the heat of the heating pin 422 to reduce upward support force. Accordingly, the lower surface 25 of the peripheral portion 24 of the case 3D and the upper surface 27 of the peripheral portion of the housing 2 come into contact with each other.

As described above, in the present embodiment, the protruding portion 420 and the heating pin 422 are applied, so that deformation speed of the protruding portion 420 can be easily adjusted by appropriately changing heating temperature of the heating pin 422.

Sixth Embodiment

In a brake ECU 1E according to a sixth embodiment, an example in which a support pin provided in a case 3 is applied as a support part will be described.

Figure 16A:
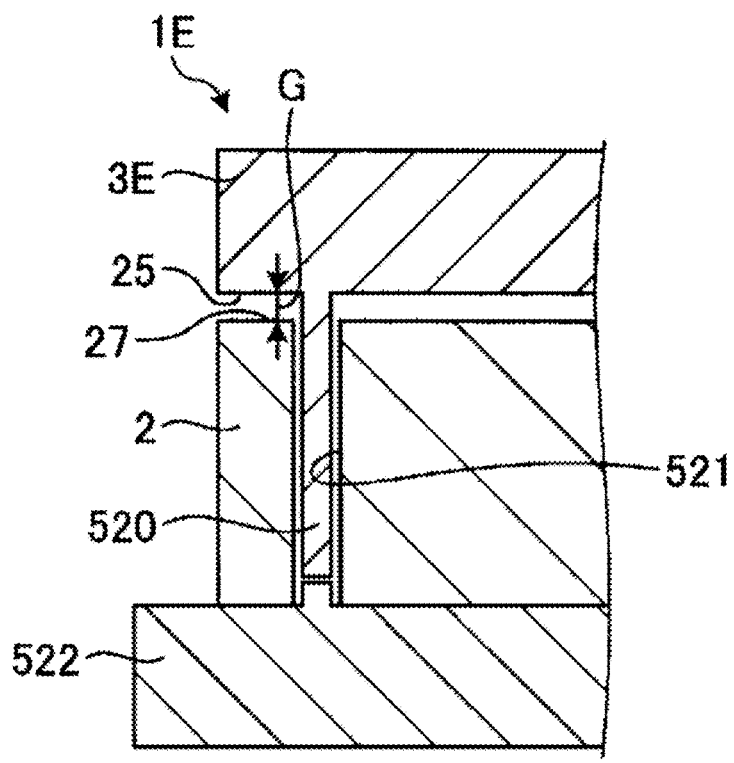
FIG. 16A is an enlarged cross-sectional view of a state in which a case is placed on a housing according to a sixth embodiment as viewed from laterally.

As illustrated in FIG. 16A, in the present embodiment, a support pin 520 is provided in a lower portion of a case 3E, a housing 2 is provided with a through hole 521 that passes through the housing 2 vertically, and a support pin 520 is housed inside the through hole 521. Below the case 3E and the housing 2, a support jig 522 is positioned.

A gap G along the vertical direction is provided between a lower surface 25 of a peripheral portion of the case 3E and an upper surface 27 of a peripheral portion of a housing 2. This is because the case 3E is supported upward with respect to the housing 2 by the support pin 520.

Even in the sixth embodiment, the gap G is maintained between the case 3E and the housing 2 when the first load is applied, as illustrated in FIG. 16A.

Figure 16B:
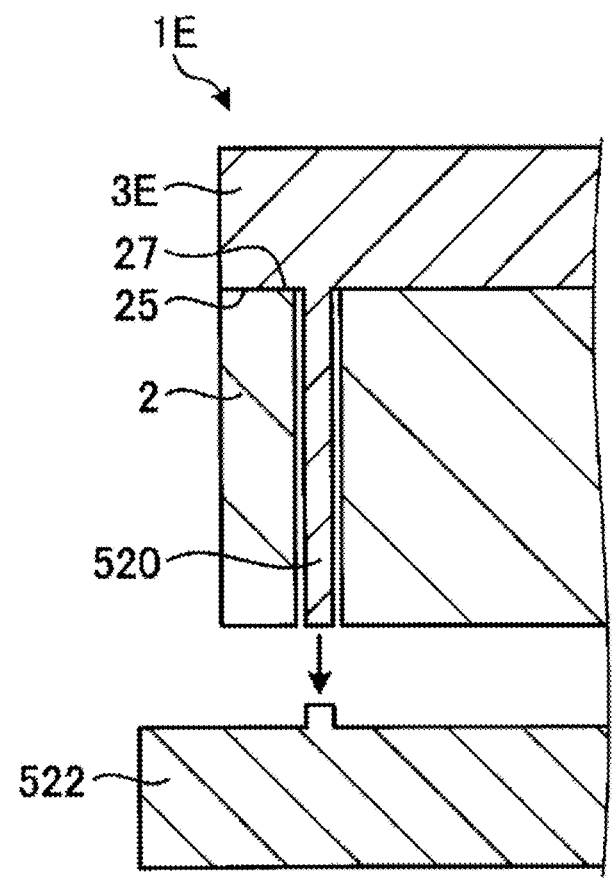
FIG. 16B is an enlarged cross-sectional view of a cross section in which the case is assembled into the housing according to the sixth embodiment as viewed from laterally.

As illustrated in FIG. 16B, when the support jig 522 is moved, support of the case 3E with the support pin 520 is released. Accordingly, the case 3E descends, and the lower surface 25 of the peripheral portion of the case 3E and the upper surface 27 of the peripheral portion of the housing 2 come into contact with each other.

As described above, in the present embodiment, the support pin 520 and the support jig 522 are applied, so that the lower surface 25 of the peripheral portion of the case 3E and the upper surface 27 of the peripheral portion of the housing 2 can be brought into contact with each other by simply removing the support jig 522.

Although the embodiments of the present invention are described above, the embodiments each described above are only an example. Thus, there is no intention to limit the scope of the invention. The novel embodiments described above can be practiced in various aspects, and various omissions, replacements, or modifications may be made within a range without departing from the essence of the invention. In addition, the embodiments and their modifications are included in the scope and essence of the invention as well as in the invention described in the scope of claims and an equivalent scope thereof. For example, while in the embodiment described above, the leaf spring is disposed in the case 3, it may be disposed in the housing 2.

The invention claimed is:

1. A liquid pressure control device comprising:
    a housing having a first surface intersecting a first direction, being provided inside with a fluid passage;
    a case having a peripheral wall, a lower surface positioned inside the peripheral wall, spaced from the first surface in the first direction, facing the first surface, an upper surface opposite to the lower surface, and a partition wall provided with a recessed portion recessed from the upper surface in a direction opposite to the first direction, and with a through hole passing through a bottom wall of the recessed portion;
    a circuit board for liquid pressure control, having a connection surface facing the upper surface, and a land provided on the connection surface;
    a connection conductor having a first end portion protruding from the recessed portion, being an end portion in the first direction, and a second end portion accommodated in the recessed portion, being an end portion in a direction opposite to the first direction, the connection conductor being electrically connected to the land in an elastically deformed state;
    a sensor attached to the housing, having a terminal protruding in the first direction and passing through the through hole, the terminal being in contact with the second end portion and electrically connected to the second end portion; and
    a deformable part positioned in a deformed state between the housing and the case in an assembled state in which the housing and the case are assembled, the deformable part enabling the housing and the case to be in a separation state in which the second end portion supported by the bottom wall is spaced from the terminal in the first direction when a first load is applied in a non-assembled state in which the case is further spaced from the housing in the first direction than in the assembled state, and the deformable part being deformed when a second load larger than the first load is applied in the non-assembled state, due to the second load, to enable the housing and the case to be in a contact state in which the second end portion and the terminal are in contact with each other.

2. The liquid pressure control device according to claim 1, further comprising an elasticity retention mechanism including an elastic holding portion that is provided in the case and elastically deformed by the first load, being a load by which the circuit board is pressed toward the partition wall, to move the circuit board to a holding position and hold the circuit board at the holding position.

3. The liquid pressure control device according to claim 1, wherein the deformable part is an elastic member that is elastically deformed in the assembled state.

4. The liquid pressure control device according to claim 1, wherein the deformable part is one of three or more deformable parts provided spaced apart from each other in a second direction intersecting the first direction.

5. The liquid pressure control device according to claim 1, wherein the deformable part is positioned between a magnetized coil provided on the first surface of the housing and the partition wall of the case.

6. The liquid pressure control device according to claim 2, wherein the deformable part is an elastic member that is elastically deformed in the assembled state.

7. The liquid pressure control device according to claim 2, wherein the deformable part is one of three or more deformable parts provided spaced apart from each other in a second direction intersecting the first direction.

8. The liquid pressure control device according to claim 2, wherein the deformable part is positioned between a magnetized coil provided on the first surface of the housing and the partition wall of the case.

9. The liquid pressure control device according to claim 3, wherein the deformable part is one of three or more deformable parts provided spaced apart from each other in a second direction intersecting the first direction.

10. The liquid pressure control device according to claim 3, wherein the deformable part is positioned between a magnetized coil provided on the first surface of the housing and the partition wall of the case.

11. A method for manufacturing a liquid pressure control device including:
    a housing having a first surface intersecting a first direction, being provided inside with a fluid passage;
    a case having a peripheral wall, a lower surface positioned inside the peripheral wall, spaced from the first surface in the first direction, facing the first surface, an upper surface opposite to the lower surface, and a partition wall provided with a recessed portion recessed from the upper surface in a direction opposite to the first direction, and with a through hole passing through a bottom wall of the recessed portion;
    a circuit board for liquid pressure control, having a connection surface facing the upper surface, and a land provided on the connection surface;
    a connection conductor having a first end portion protruding from the recessed portion, being an end portion in the first direction, and a second end portion accommodated in the recessed portion, being an end portion in a direction opposite to the first direction, the connection conductor being electrically connected to the land in an elastically deformed state; and
    a sensor attached to the housing, having a terminal protruding in the first direction and passing through the through hole, the terminal being in contact with the second end portion and electrically connected to the second end portion, the method comprising:
    a first step of applying a first load to an elasticity retention mechanism to hold the circuit board by the elasticity retention mechanism by pressing the circuit board against the case in a direction opposite to the first direction, while the case is supported in the first direction by a support part, to cause a separation state in which the case is further spaced from the housing in the first direction than in an assembled state in which the housing and the case are assembled, and in which the second end portion supported by the bottom wall is spaced from the terminal in the first direction; and a second step of causing the case to approach the housing in the direction opposite to the first direction with the circuit board held by the elasticity retention mechanism to assemble the housing and the case.

* * * * *